United States Patent [19]

Jordan

[11] 3,808,070

[45] Apr. 30, 1974

[54] BEVELED EDGE PHOTOETCHING OF METAL-IRON FILM

[75] Inventor: John R. Jordan, Phoenix, Ariz.

[73] Assignee: General Electric Company, New York, N.Y.

[22] Filed: Jan. 2, 1973

[21] Appl. No.: 320,234

Related U.S. Application Data

[63] Continuation of Ser. No. 78,038, Oct. 5, 1970, abandoned.

[52] U.S. Cl......................... 156/8, 156/18, 252/79.2

[51] Int. Cl. ............................................... C23f 1/02

[58] Field of Search ........................ 156/3, 8, 11, 18; 252/79.2

[56] References Cited

UNITED STATES PATENTS

| | | | |
|---|---|---|---|
| 3,057,764 | 10/1962 | LaBoda et al. .................... | 156/18 X |
| 3,210,226 | 10/1965 | Young ............................. | 156/11 X |

*Primary Examiner*—William A. Powell
*Attorney, Agent, or Firm*—Edward W. Hughes; Walter W. Nielsen

[57] ABSTRACT

Metal-iron films are etched with a solution which includes nitric acid to obtain beveled or tapered film edges.

4 Claims, 4 Drawing Figures

INVENTOR.
JOHN R. JORDAN
BY Calvin E. Thorpe
ATTORNEY

BEVELED EDGE PHOTOETCHING OF METAL-IRON FILM

This is a continuation of application Ser. No. 78,038, filed Oct. 5, 1970, now abandoned.

BACKGROUND OF THE INVENTION

This invention relates to photoetching of thin films and more particularly to a method and solution for photoetching metal-iron film to obtain beveled or tapered film edges.

Photoetching is an important tool in the fabrication of multilayer thin film circuit structures. The photoetching process normally consists of coating a layer of material to be photoetched with a light-sensitive substance, termed a "resist" or "photoresist", placing a mask configured in a desired pattern over the photoresist, and then exposing the photoresist not covered by the mask to light. The photoresist is light sensitive such that exposure to light produces a change in its molecular structure. Negative type photoresists are monomers which become polymerized when exposed to light. The unpolymerized monomer is washed away by a developer solution thereby exposing that part of the material which is to be etched. Since the polymerized photoresist is insoluble to etching agents or etchants, an etchant, when applied to the material and photoresist, dissolves or removes material only from those areas unprotected by the photoresist. In this manner, a desired configuration or pattern in the material is obtained. The photoresist is then removed, completing the process.

With positive type photoresists, light causes a photodecomposition of the resist. Then, rather than washing away the non-exposed resist (as with negative type photoresists), the developer solution washes away the exposed and decomposed resist. An etchant is then used to remove material from those areas unprotected by the resist.

One of the materials found useful for multilayer thin film structures is metal-iron alloys, and in particular nickel-and/or cobalt-iron magnetic alloys (hereinafter referred to as nickel/cobalt-iron alloy). Nickel/cobalt-iron magnetic alloy may be used, for example, in thin film magnetic memories, thin film magnetic transducers, etc. Use of the material in such structures often requires deposition of other materials, such as insulation, over a previously etched layer of nickel/cobalt-iron material. Because the etchant commonly used to etch nickel/cobalt-iron films -- a ferric chloride solution -- produces edges in the film which are rough and nearly perpendicular to the surface of the film, the layers of materials deposited over an etched layer of nickel/cobalt-iron film typically have a non-uniform thickness. Specifically, deposited material is not as thick over the etched edges of the film as it is over other parts of the film and substrate.

It is obvious that non-uniformity of thickness of a layer of material in a multilayer structure could give rise to a defective structure. For example, if the layer in question were a layer of insulation for providing electrical isolation between two other layers, excessive thinness at some point in the insulation layer could result in a short across the layer thereby destroying the electrical isolation. Alternatively, if the layer in question were an electrically conductive layer, non-uniformity in the thickness of the layer could give rise to undesirable conduction characteristics in the layer.

SUMMARY OF THE INVENTION

It is an object of the present invention, in view of the above-described prior art, to provide a method and photoetching solution for photoetching metal-iron films.

It is another object of the present invention to provide a method and photoetching solution for photoetching metal-iron films so that the film edges resulting from the photoetching are susceptible of being uniformly covered by another deposited material.

It is still another object of the present invention to provide a method and photoetching solution for photoetching metal-iron films so that the etched film edges are tapered or beveled.

These and other objects are achieved utilizing an illustrative method and photoetching solution in which a metal-iron film is coated with photoresist of a desired pattern and then spray etched with an aqueous solution of nitric acid and ferric chloride. Those areas of the film unprotected by the photoresist are removed by the solution leaving a film having beveled or tapered edges. After the photoresist is removed, subsequent layers of material may be deposited over the film and such layers will have a substantially uniform thickness over all portions of the film.

DETAILED DESCRIPTION

Figure 1:
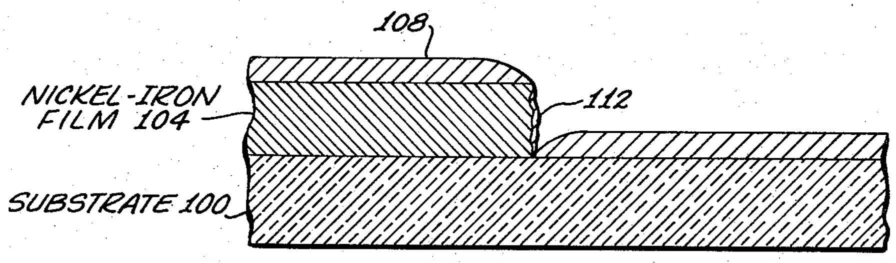
PRIOR ART FIG-1
FIG. 1 is a cross-sectional view of a layer of nickel-iron film and a layer of material deposited over the film illustrating the edge geometry of a film etched in accordance with the prior art.

For the purpose of better illustrating the advantages of the present invention, reference is made to FIG. 1 which shows the edge geometry of nickel-iron film etched in accordance with the prior art. As indicated in the drawing, nickel-iron has been etched from the right-half portion of a substrate 100, leaving a layer of nickel-iron film 104, having a rough vertical edge 112. This would occur, for example, if the nickel-iron film had been etched with a ferric-chloride solution.

Another layer of material 108 is shown covering the nickel-iron film 104 and substrate 100. As also indicated in the drawing, the thickness of the material 108 is not uniform over the film-substrate structure, but rather is thinner at the edge 112 of the film than at any other point.

Figure 2:
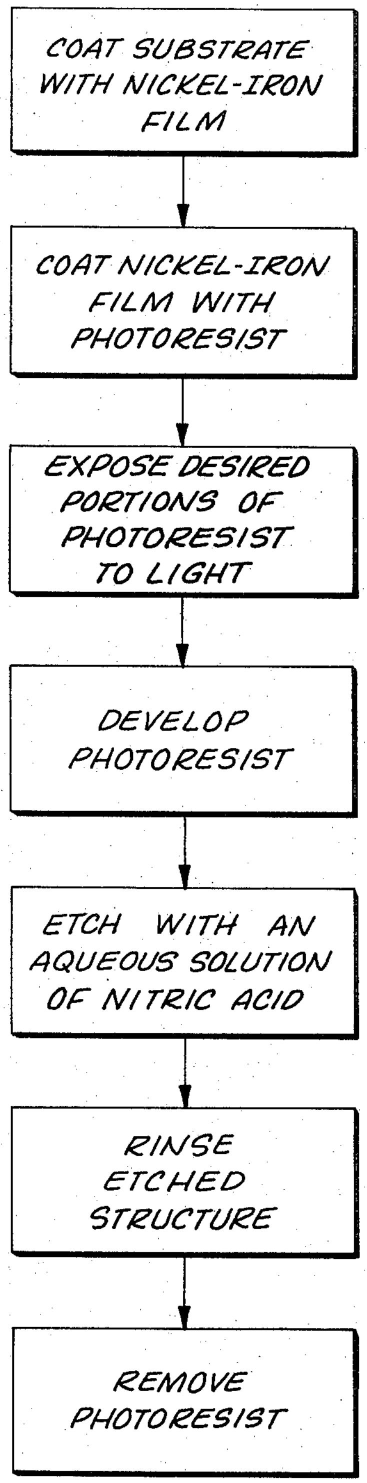
FIG. 2 is a flow chart of the method of photoetching of nickel-iron film to obtain beveled edges in accordance with the present invention.

The method for etching metal-iron films generally and nickel-iron films in particular in accordance with the present invention is shown in the flow chart of FIG. 2. The first step of the method is to coat a suitable substrate with a nickel-iron film utilizing any one of a number of well-known deposition techniques such as sputtering, vacuum deposition, or plating. The nickel-iron film is then coated with a photoresist of either the positive or negative type. For example, a positive type photoresist such as AZ-135OH, manufactured and marketed by Shipley Company, Inc., Newton, Massachusetts, could be employed. The photoresist is then dried and baked in accordance with the instructions of the manufacturer.

Upon completion of baking, a pattern photo mask is placed over the photoresist and then those portions of the photoresist not covered by the mask are exposed to an intense light, the wavelenghts of which are preferably rich in the ultraviolet band of the spectrum. If negative photoresist is used, the light causes polymerization of the photoresist monomer, and the resulting polymer is impervious to a developer solution and to the etchant. If a positive photoresist is used, the light will cause decomposition of the exposed portions and the products of the decomposition will be soluble in a typically basic developer solution.

After exposing the desired portions of the photoresist to light, the photoresist is developed leaving the desired pattern in the photoresist, thereby exposing certain portions of the nickel-iron film.

The structure is then etched with an aqueous solution of nitric acid. Spray etching appears to be the preferable manner, but ultrasonic agitation, mechanical agitation, immersing, or other suitable processes may be used. The spray etching process, shown graphically in FIG. 3, will be discussed in greater detail later.

The amount of nitric acid in the etching solution determines the rate at which the etching will take place. The greater the concentration of nitric acid, the greater is the rate of etching. If the concentration of nitric acid is too great, the etching process is more difficult to control, i.e., it is more difficult to obtain the exact amount of desired etching.

It has also been found advantageous to include some ferric chloride in the etching solution. The ferric chloride in the solution appears to accelerate the formation of nitrogen oxides, which, in turn, as will be explained later, appear to be the agents which cause the beveled edge etching. If the concentration of ferric chloride is too great, however, then the ferric chloride may become the dominant etching agent with the result that the edges of the etched nickel-iron film are not beveled or tapered to the degree desired.

For etching metal-iron films generally to achieve beveled edges, it has been found advantageous to utilize an etchant solution which includes, by volume, about one part 35° Baume Ferric chloride solution (hereinafter referred to simply as ferric chloride), about 15 parts solution of concentrated 70 percent nitric acid (hereinafter referred to simply as nitric acid) and from about 5 to 300 parts aqueous solvent. For beveled-edge etching of nickel/cobalt-films having a concentration of iron of at least about 40 percent (by weight), it has been found advantageous to utilize an etchant solution which includes about 3,600 parts aqueous solvent, from about 60 to 3,600 parts nitric acid, and a concentration of ferric chloride of from one part up to an amount not exceeding the corresponding amount of nitric acid. For beveled-edge etching of nickel/cobalt-films having a concentration of iron of not more than thirty percent (again by weight), it has been found advantageous to utilize an etchant solution including about 20 parts aqueous solvent, about 10 parts nitric acid, and from zero to about 1 part ferric chloride.

Figure 3:
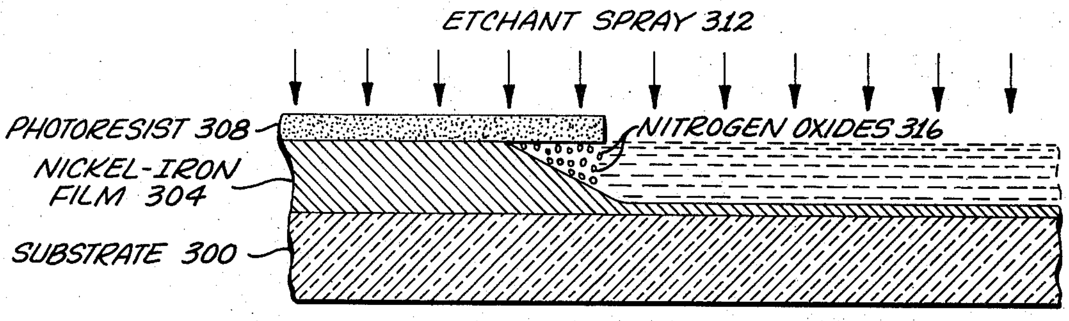
FIG. 3 is a cross-sectional view of a layer of nickel-iron film and photoresist graphically illustrating the etching process of the present invention.

As indicated earlier, a graphic representation of the spray etching process is shown in FIG. 3. In the figure, a partially etched layer of nickel-iron film 304 is shown deposited on a substrate 300. A layer of photoresist 308 partially covers the nickel-iron film 304. An etchant spray 312 is applied to the surface of the photoresist 308 and the nickel-iron film 304 as shown in the figure. The dotted lines parallel to the etched portion of the nickel-iron film 304 represent the various stages of the etching of the film. As the etching process commences, nitrogen oxides 316 such as nitrous oxide, nitric oxide and nitrogen dioxide are formed as etching by-products. These oxides collect along the edge of the photoresist, thereby accelerating the etching near, and later underneath, the photoresist edge. This etching action at the photoresist edge causes undercutting and thus the formation of the beveled edge on the nickel-iron film 304.

After the structure is etched to the satisfaction of the user, it is rinsed to stop the action of the etchant. See FIG. 2. The photoresist is then stripped by applying a stripping solution such as an activated chlorinated solvent for negative photoresists or acetone for positive photoresists. The etched structure is then washed and dried in preparation, for example, for the deposition of another layer over the structure.

Figure 4:
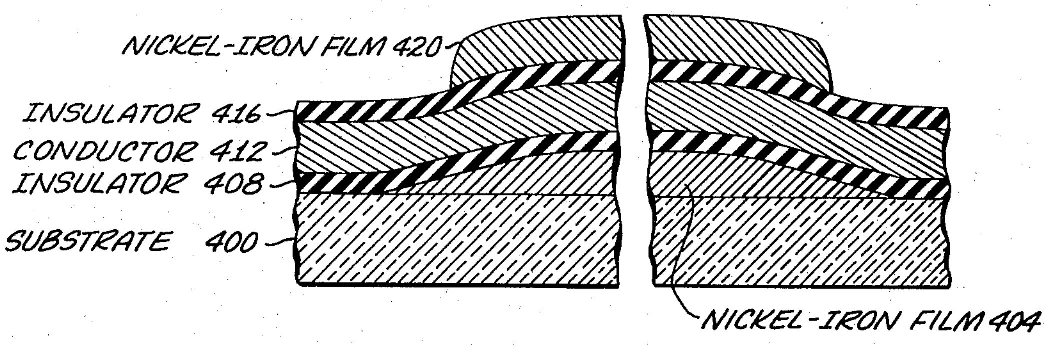
FIG. 4 is a cross-sectional view of a thin film structure which includes a layer of nickel-iron material having beveled edges etched in accordance with the present invention.

FIG. 4 shows an exemplary structure illustrating the advantages of the present invention. The FIG. 4 drawing is a cross-section of a thin film magnetic transducer head for writing onto and reading from magnetic tapes, drums or discs. The structure includes a substrate 400 having a first layer of magnetic nickel-iron film 404 deposited thereon. The nickel-iron film 404 is etched in accordance with the present invention to achieve beveled edges as shown in the drawing. A layer of insulation 408 is then deposited over the substrate 400 and the nickel-iron film 404. The beveled edges of the film 404 facilitate the deposition of a layer of insulation having a uniform thickness. This might be contrasted with the prior art shown in FIG. 1. A conductor 412 is then deposited over the insulator 408. Because of the beveled edges of the nickel-iron film 404, the conductor layer 412 likewise has a uniform thickness. Another layer of insulation 416 is then deposited over the conductor 412 and finally another layer of magnetic nickel-iron film 420 is deposited on the insulator 416.

The two layers of nickel-iron 404 and 420 operate as poles of a magnet. These poles are "biased" in accordance with the direction of current in the conductor 412. Similarly, when a magnetized magnetic tape, drum or disc are passed in front of the poles, a current is produced in the conductor 412 whose direction is dependent upon the magnetization of the tape, drum or disc. With the structure shown in FIG. 4, it is important that there be no electrical shorts between the nickel-iron poles 404 and 420 and the conductor 412. By providing a first layer of nickel-iron film 404 with beveled edges, the possibility of an electrical short through the insulators 408 and 416 is reduced considerably. Furthermore, since the conductor 412 has a uniform cross-section, its current carrying capabilities are optimized.

It is to be understood that the above-described embodiments are only illustrative of the application of the principles of the present invention. Numerous modifications of arrangements, proportions, elements, and materials, used in the practice of the invention, and particularly adapted for specific environments and operating requirements, may be devised by those skilled in the art without departing from the spirit and scope of the invention.

What is claimed is:

1. In the fabrication of multilayer thin film circuit structures, a process for photoetching the thin film, comprising the steps of:

depositing on a substrate a homogeneous thin film of nickel/cobalt-iron;

coating the thin film with photoresist;

exposing in a predetermined pattern selected portions of the photoresist to light;

developing the exposed photoresist to remove the undesired portions of the pattern of photoresist from the thin film;

applying an etchant solution to the nickel/cobalt-iron film and the photoresist, said etchant including, by volume, up to about one part 35° Baume ferric chloride solution, about fifteen parts nitric acid, and from about five to three-hundred parts aqueous solvent; and stopping the action of the applied etchant when the thin film unprotected by the photoresist is etched away, the remaining thin film thereby having beveled edges.

2. In the fabrication of multilayer thin film circuit structures, a process for photoetching the thin film, comprising the steps of:

depositing on a substrate a homogeneous thin film of nickel/cobalt-iron having at least 40 percent iron by weight;

coating the thin film with photoresist;

exposing in a predetermined pattern selected portions of the photoresist to light;

developing the exposed photoresist to remove the undesired portions of the pattern of photoresist from the thin film;

applying an etchant solution to the nickel/cobalt-iron film and the photoresist, said etchant including, by volume, about 3,600 parts aqueous solvent, from 60 to 3,600 parts of concentrated 70 percent nitric acid, and an amount of 35° Baume ferric chloride solution of from one part up to an amount not exceeding the corresponding amount of nitric acid; and stopping the action of the applied etchant solution when the thin film unprotected by the photoresist is etched away, the remaining pattern of thin film thereby having beveled edges.

3. A process as claimed in claim 2 wherein said etchant solution includes, by volume, about eight parts of said aqueous solution, about four parts of said nitric acid, and about one part of said ferric chloride.

4. In the fabrication of multilayer thin film circuit structures, a process for photoetching the thin film, comprising the steps of:

depositing on a substrate a homogeneous thin film of nickel/cobalt-iron having not more than about 30 percent iron by weight;

coating the thin film with photoresist;

exposing in a predetermined pattern selected portions of the photoresist to light;

developing the exposed photoresist to remove the undesired portions of the pattern of photoresist from the thin film;

applying an etchant solution to the nickel/cobalt-iron film and photoresist, said etchant including, by volume, about 20 parts aqueous solvent, about 10 parts concentrated 70 percent nitric acid, and from zero to about one part 35° Baume ferric chloride solution; and stopping the action of the applied etchant solution when the thin film unprotected by the photoresist is etched away, the remaining pattern of thin film thereby having beveled edges.

* * * * *